(12) United States Patent
Hissen

(10) Patent No.: US 10,459,259 B2
(45) Date of Patent: Oct. 29, 2019

(54) METHOD AND SYSTEM FOR ELECTRO-ABSORPTION MODULATOR DRIVERS IN CMOS

(71) Applicant: Maxlinear, Inc., Carlsbad, CA (US)

(72) Inventor: Jurgen Hissen, Carlsbad, CA (US)

(73) Assignee: Maxlinear, Inc., Carlsbad, CA (US)

( * ) Notice: Subject to any disclaimer, the term of this patent is extended or adjusted under 35 U.S.C. 154(b) by 0 days.

(21) Appl. No.: 15/865,624

(22) Filed: Jan. 9, 2018

(65) Prior Publication Data

US 2018/0196287 A1    Jul. 12, 2018

Related U.S. Application Data

(60) Provisional application No. 62/444,111, filed on Jan. 9, 2017.

(51) Int. Cl.
*G02F 1/01* (2006.01)
*G02F 1/015* (2006.01)
(Continued)

(52) U.S. Cl.
CPC ............ *G02F 1/015* (2013.01); *G02F 1/0121* (2013.01); *G05F 1/585* (2013.01); *G02F 2001/0157* (2013.01); *H03M 1/66* (2013.01)

(58) Field of Classification Search
CPC . G02F 1/00; G02F 1/01; G02F 1/0121; G02F 1/0123; G02F 1/015; G02F 1/17; G02F 1/19; G02F 2001/0155; G02F 2001/0157; G02F 2001/015; H03M 1/66; H04B 10/40; H04B 10/50; H04B 10/503; H04B 10/505; H04B 10/5057; H04B 10/50575; H04B 10/54; H04B 10/541; H04B 10/564; H04B 10/58; H04B 10/588;
(Continued)

(56) References Cited

U.S. PATENT DOCUMENTS 5,546,218 A * 8/1996 Komatsubara ........ G02F 1/0121
359/237
5,706,117 A * 1/1998 Imai ...................... G02F 1/0123
372/29.02

(Continued)

*Primary Examiner* — William R Alexander
(74) *Attorney, Agent, or Firm* — McAndrews, Held & Malloy

(57) ABSTRACT

Methods and systems for electro-absorption modulator drivers in CMOS may comprise an electro-absorption modulator optically coupled to a laser source and electrically coupled to a modulator driver circuit that is in a complementary metal oxide semiconductor (CMOS) chip. The electro-absorption modulator includes a summer for receiving a negative bias voltage and a programmable offset voltage, a voltage regulator for receiving the output of the summer and generating a negative DC voltage of lower magnitude than the negative bias voltage, level shifting circuitry for shifting a received data signal to a DC voltage level between the negative DC voltage from the voltage regulator and the negative bias voltage, and an electrical coupling structure for DC-coupling the level shifted data signal to the modulator. The bias voltage may be received from an off-chip low drop out (LDO) voltage regulator. The level shifting circuitry may include cascode CMOS transistors and a current mirror.

24 Claims, 7 Drawing Sheets

(51) Int. Cl.
*G05F 1/585* (2006.01)
*H03M 1/66* (2006.01)

(58) Field of Classification Search
CPC ... H04B 10/60; G05F 1/00; G05F 1/10; G05F 1/585; H01S 3/00; H01S 3/13
USPC ......... 359/237–239, 245, 276; 327/50, 124; 398/83, 135–137, 140, 93, 94, 182, 195, 398/198; 323/234; 372/9, 12, 31, 29.01, 372/29.011–29.015, 38.01, 38.02, 38.1
See application file for complete search history.

(56) References Cited

U.S. PATENT DOCUMENTS

| | | | | |
|---|---|---|---|---|
| 6,108,119 | A * | 8/2000 | Devenport | G02F 1/0121 359/237 |
| 7,065,301 | B2 * | 6/2006 | Shastri | G02F 1/0121 359/237 |
| 7,340,184 | B2 * | 3/2008 | Frederiksen, Jr. | G02F 1/0123 398/195 |
| 7,450,787 | B2 * | 11/2008 | Kucharski | G02F 1/025 385/2 |
| 7,515,775 | B1 * | 4/2009 | Kucharski | G02F 1/025 385/1 |
| 7,848,369 | B1 * | 12/2010 | Bostak | G02F 1/0121 359/237 |
| 8,989,598 | B2 * | 3/2015 | Azadeh | H05B 33/0812 307/154 |
| 9,306,546 | B2 * | 4/2016 | Daghighian | H04B 10/40 |
| 9,941,864 | B2 * | 4/2018 | Daghighian | H04B 10/40 |
| 10,036,904 | B1 * | 7/2018 | Nagarajan | G02F 1/025 |

\* cited by examiner

METHOD AND SYSTEM FOR ELECTRO-ABSORPTION MODULATOR DRIVERS IN CMOS

CLAIM OF PRIORITY

This patent application makes reference to, claims priority to and claims benefit from the U.S. Provisional Patent Application Ser. No. 62/444,111, filed on Jan. 9, 2017, which is hereby incorporated herein by reference in its entirety.

TECHNICAL FIELD

Aspects of the present application relate to communications. More specifically, certain embodiments of the disclosure relate to a method and a system for electro-absorption modulator drivers in CMOS.

BACKGROUND

Limitations and disadvantages of conventional and traditional approaches to optical communications will become apparent to one of skill in the art, through comparison of such systems with some aspects of the present invention as set forth in the remainder of the present application with reference to the drawings.

BRIEF SUMMARY

Systems and methods are provided for electro-absorption modulator drivers in CMOS, substantially as shown in and/or described in connection with at least one of the figures, as set forth more completely in the claims.

These and other advantages, aspects and novel features of the present disclosure, as well as details of illustrated implementation(s) thereof, will be more fully understood from the following description and drawings.

DETAILED DESCRIPTION

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first plurality of lines of code and may comprise a second "circuit" when executing a second plurality of lines of code. As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As utilized herein, the terms "block" and "module" refer to functions than can be performed by one or more circuits. As utilized herein, the term "example" means serving as a non-limiting example, instance, or illustration. As utilized herein, the terms "for example" and "e.g.," introduce a list of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled, or not enabled, by some user-configurable setting.

Figure 1:
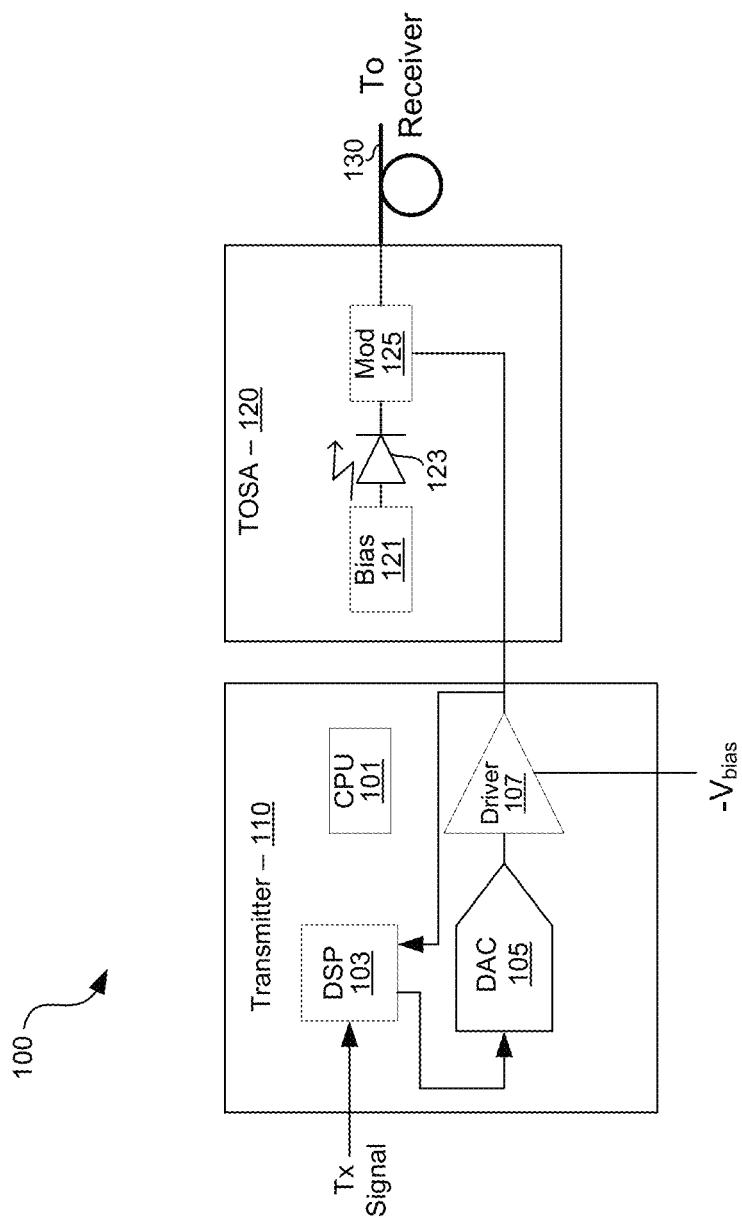
FIG. 1 shows an example optoelectronic transceiver in accordance with an example embodiment of this disclosure.

FIG. 1 shows an example optoelectronic transceiver in accordance with an example embodiment of this disclosure. The system 100 comprises optoelectronic transmitter 110, a transmit optical subassembly (TOSA) 120, and a fiber 130. The transmitter 110 may be part of a transceiver that also has a receiver section for receiving optical signals over the optical fiber 130 and/or another optical fiber.

The transmitter 110 comprises a CPU 101, a digital signal processing circuit (DSP) 103, a digital-to-analog converter (DAC) 105, and a modulator driver circuit 107. The TOSA 120 comprises a bias circuit 121, a laser diode 123, and a modulator 125. The TOSA 120 may comprise a package footprint and connector as defined by an optical communication systems standard for coupling to optical networks. In an example embodiment, the transmitter 110 is integrated in a CMOS chip that is electrically coupled to, or integrated within the TOSA 120.

The CPU 101 may be operable to manage operations of the transmitter 110. As discussed in further detail below, such management may comprise, for example, controlling the modulation of the optical signals communicated out of the TOSA 120 by configuring the driver circuit 107 and/or the DSP 103. The CPU 101 may be integrated in a CMOS chip along with the other components of the transmitter 110.

The DSP 103 may be operable to receive one or more streams of data and process the data to generate a signal suitable for the modulator 125 via the driver circuitry 107. The DAC 105 may be operable to convert the digital signal output by the DSP 103 to generate an analog waveform for driving the modulator 125 in the TOSA 120. While the DAC 105 and driver circuit 107 are drawn as separate functions, they may be implemented as a single physical structure.

The bias circuit 121 may be operable to provide proper bias conditions for the laser diode 123. For example, the bias circuit 121 may provide a bias voltage and current that puts the laser diode in a desired operation range in terms of output power, linearity, and/or other parameters. The laser diode 123 may be operable to generate a continuous-wave (CW) optical signal having an intensity proportional to the current output by the bias circuit 121. The modulator 125 may comprise an electro-absorption (EA) modulator, for example, where the received optical signal may have minimal attenuation in the modulator 125 for a high output optical signal or may be biased in an absorption mode where the output optical signal is to be reduced, thereby modulating the optical signal from the laser diode 123.

In an example scenario, the driver 107 may comprise CMOS circuitry that supports large negative voltages with DC-coupling to the modulator 125, which eliminates DC-blocking components, e.g., coupling capacitors, and thereby reduces board congestion and improves signal quality. Supporting large negative voltages in CMOS enables low-cost integration, while conventional implementations rely on low-integration bipolar processes. In an example scenario, the driver may receive voltages regulated in the −3 to −5 V range from one or more low-dropout (LDO) voltage regulators.

The output signal of the driver 107 coupled to the modulator 125 may be sensed and fed back to the DSP 103, and/or other processing circuitry such as an analog to digital converter (ADC). The sensed output may be utilized to optimize the biasing conditions for the modulator 125 and/or the driver 107 based on reflections of the transmitted signals at the modulator 125. These reflections may be proportional to the incremental resistance of the modulator 125, which is a minimum at the point of maximum absorption gain, i.e., the maximum optical modulation amplitude (OMA).

In operation, an input Tx electrical signal may be received by the DSP 103 from elsewhere in the chip comprising the transceiver or may be received from off-chip, processed for a desired modulation type, and communicated to the DAC 105. The DAC 105 may then convert the digital signal to an analog signal for driving the modulator 125 via the driver 107. The driver 107 may generate an output signal with a configurable negative DC component and may be DC coupled to the modulator 125, i.e., not utilize any coupling capacitors, thereby allowing DC voltages to be coupled to the modulator 125. The laser diode 123 may be biased by the bias circuit 121 to generate a desired amplitude output optical signal, which may be modulated by the modulator 125. The modulated optical signal may then be communicated out of the system 100 via the optical fiber 130.

Figure 2:
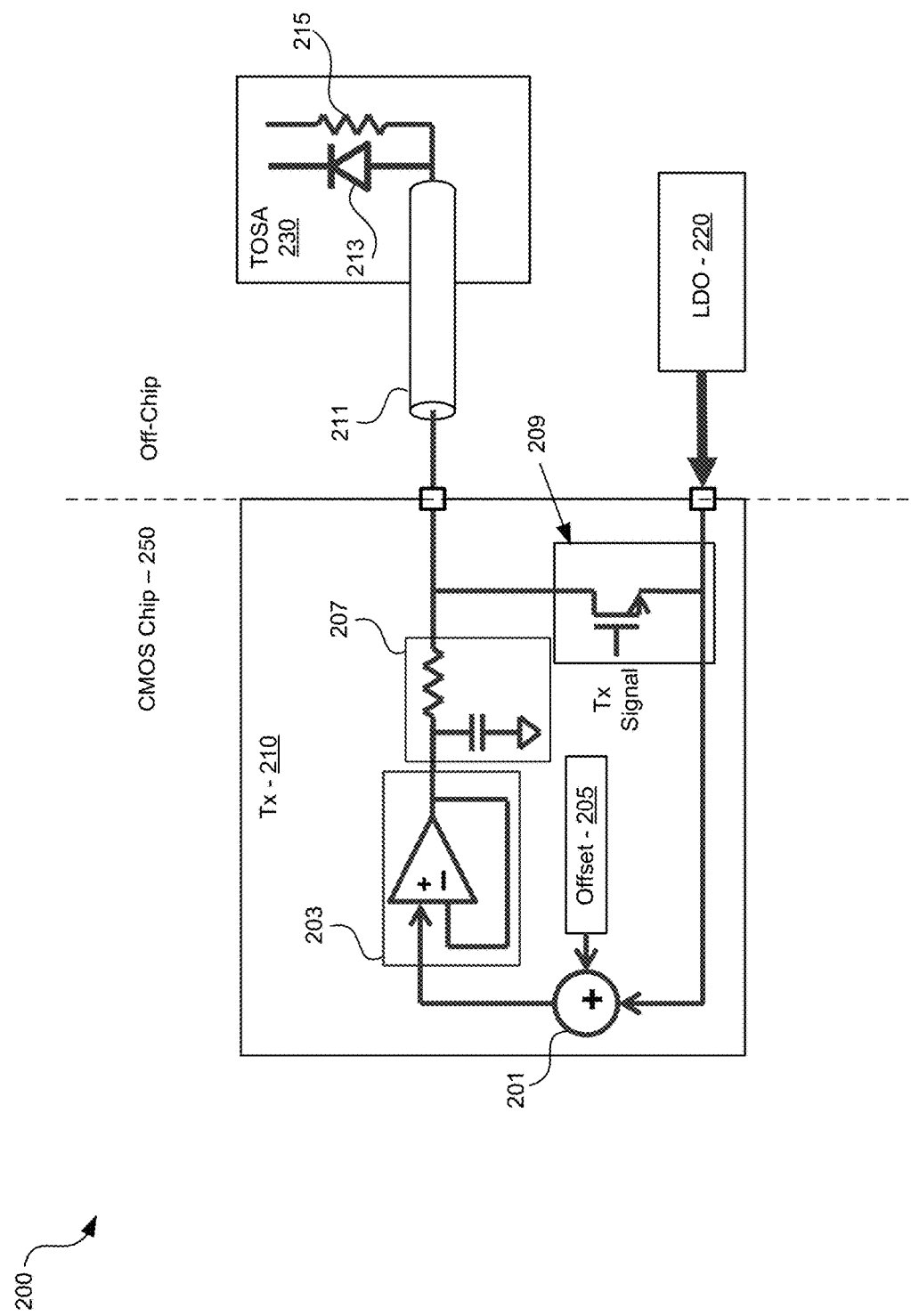
FIG. 2 illustrates a modulator driver circuit, in accordance with an example embodiment of the disclosure.

FIG. 2 illustrates a modulator driver circuit, in accordance with an example embodiment of the disclosure. Referring to FIG. 2, there is shown transmitter 200 comprising a Tx driver 210, a low drop-out (LDO) regulator 220, and a TOSA 230. The Tx driver 210 may be integrated in a CMOS chip 250, and while the LDO 220 is shown as off-chip, it may also be integrated on the CMOS chip 250.

The TOSA 230 may comprise optoelectronic components, such as an electro-absorption (EA) modulator, for transmitting optical signals into an optical fiber based on electrical signals received from the transmitter 210. Accordingly, the TOSA 230 electrical model comprises a diode 213, with an effective absorption resistance described by a nonlinear resistor 215. An electrical coupling structure 211 is utilized to communicate electrical signals from the Tx driver 210 to the TOSA 230, and accordingly to the EA modulator 213, as shown in FIG. 1 for example. The electrical coupling structure 211 may comprise a transmission line or other suitable conductive structure for communicating electrical signals over the required distance from the Tx driver 210 to the TOSA 230.

The Tx driver 210 may comprise circuitry for generating a DC-coupled drive signal for the modulator in the TOSA 230. The drive signal may be configured at large negative DC voltage levels, that is, large in terms of typical CMOS negative voltages. In an example scenario, the Tx driver 210 circuitry may comprise a summer 201, a voltage-regulator 203, a termination filter 207, and an output driver 209.

Summer 201 may be operable to receive input voltage signals from the LDO regulator 220 and sum this voltage with the offset voltage 205 to provide an output control signal to the DC voltage regulator 203. The termination filter 207 may function as a low-pass filter to filter out high frequency noise in the bias voltage provided by the voltage regulator 203, and to provide termination for reflected signals. The voltage regulator 203 is a feedback structure and it may be advantageous to take the feedback from after the termination filter 207 instead of before it. This and other design optimizations fall within the scope of this disclosure.

The DC-coupled Tx driver 210 eliminates the need for DC-blocking components, such as on-chip or off-chip capacitors, which improves signal integrity and reduces board congestion. Supporting large negative voltages in CMOS enables low-cost integration, while conventional implementations rely on low-integration bipolar processes.

The LDO regulator 220 comprises circuitry for providing a stable DC voltage based on a received DC voltage without significant voltage drop, and may be operable to provide a large negative voltage to the Tx driver 210. The input voltage from the LDO regulator 220 may be in the range of −3.2V to −4.7V and the DC level of the output of the Tx driver 210 coupled to the TOSA 230 may be in the −0.5V to −2V range, which are outside the conventional operating range of high-speed CMOS fabricated in standard bulk CMOS processes. By using level-shifting, as illustrated with respect to FIG. 3, these voltage levels may be generated in the Tx driver 210 without driving individual bulk CMOS transistors beyond their normal voltage ranges.

Figure 3:
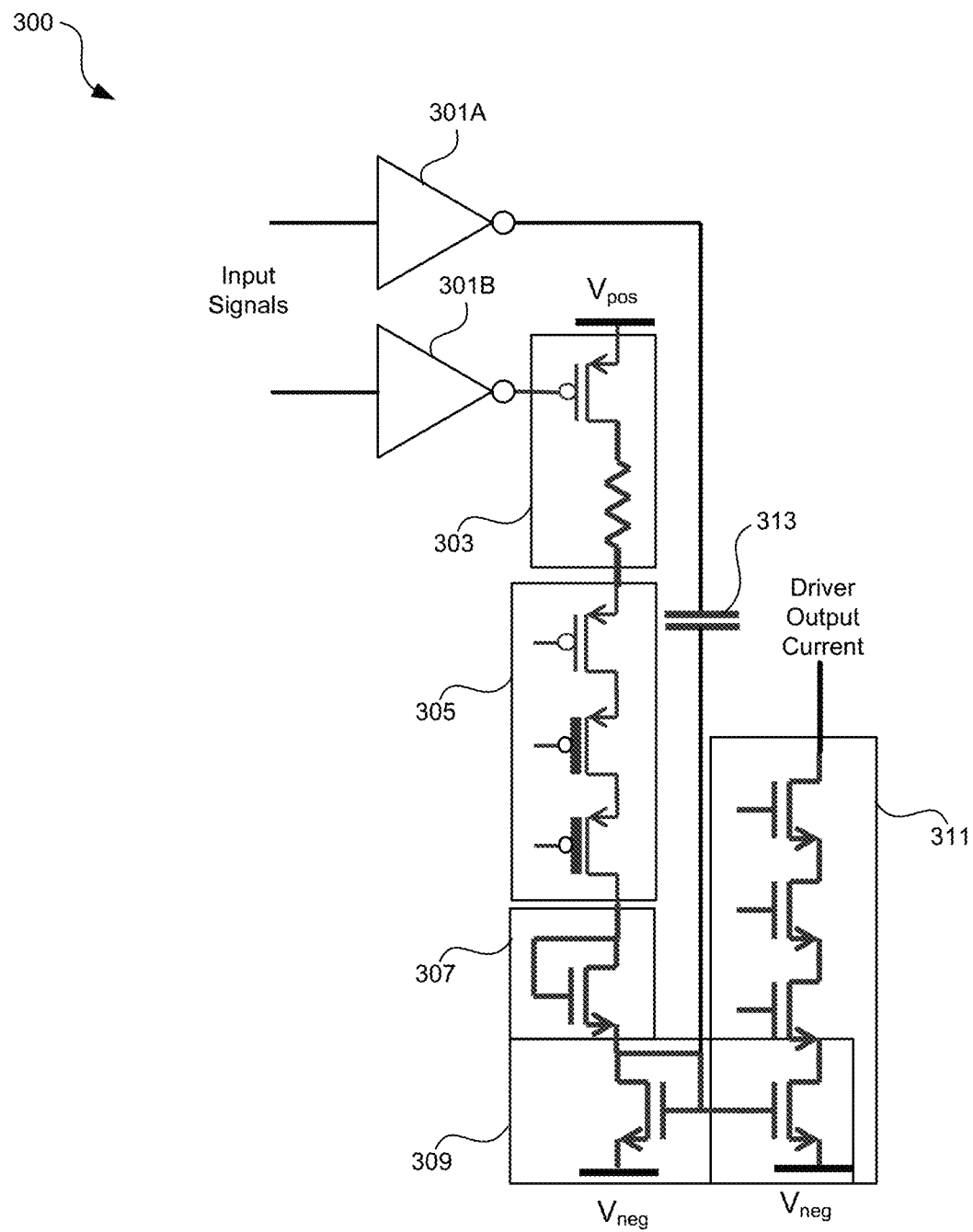
FIG. 3 illustrates an example implementation of a negative voltage DC-coupled modulator driver, in accordance with an example embodiment of the disclosure.

The output driver 209 may comprise circuitry for providing an output current at a negative bias proportional to an input voltage, labeled Tx Signal, utilizing cascode CMOS transistors, diode-connected transistors, current mirrors, and stacked output stages, for example, as shown further with respect to FIG. 3.

FIG. 3 illustrates an example implementation of a negative voltage DC-coupled modulator driver, in accordance with an example embodiment of the disclosure. Referring to FIG. 3, there is shown modulator driver 300, which may be an example schematic for output driver 209 from FIG. 2. The modulator driver 300 comprises inverters 301A and 301B, transconductor 303, cascode CMOS transistors 305, diode connected transistor 307, current mirror 309, stacked output stages 311, and capacitor 314. Vpos and Vneg may comprise positive and negative bias voltages for the modulator driver 300. In an example scenario, Vpos may be ground. In addition, the modulator driver 300 comprises a level-shifting predriver combining NMOS current-mirror structures and an AC-bypass capacitor 313, as described below.

The inverters 301A and 301B may be operable to receive input signals for configuring the modulator driver 300 output current. The output of the inverter 301A may be AC-coupled to the common gate terminal of the current mirror 309, whereas the output of the inverter 301B may be coupled to the transconductor 303. The transconductor 303 may comprise a PMOS transistor and a resistor, for example, that generates an output current proportional to the input voltage, which is the output voltage from the inverter 301B.

The cascode CMOS transistors 305 comprise both thin and thick oxide CMOS transistors, for example, as indicated by the thick and thin lines representing the gate oxides, which allows for a voltage versus speed trade-off for the driver, where the voltage drop across the cascode transistors 305 may be configured by the gate voltages of the CMOS transistors. In addition, diode-connected transistor 307 can provide a voltage burn-off, for further step-down of the voltage if required, with a further trade-off against speed.

The current mirror 309 may comprise common gate-coupled NMOS transistors with one MOS transistor diode-coupled, for example, for providing an output current to the stacked output stages 311 proportional to the current provided by the diode-connected transistor 307.

The stacked output stages 311 may comprise thin oxide NMOS transistors using a triple-well design to support voltages beyond conventional drain/bulk breakdown in bulk CMOS transistors. The structure provides the power supply rejection ratio of current-mode operation and the bandwidth of voltage-mode operation, thereby enabling improved signal integrity with low-cost CMOS integration. The structure shown may generate output signals with a DC voltage offset of −3.2 V with a −5 V supply. Finally, the current-mode driver maximizes swing for a given supply voltage.

In operation, input signals may be coupled to one or both of the inverters 301A and 301B, where the transconductor 303, cascodes 305, diode-connected transistor 307 provide a negative DC bias to the signal applied to the inverter 301B, the current being mirrored to the stacked output stages 311 utilizing the current mirror 309. In addition the output of the inverter 301A may be AC-coupled to the common-gate connection of the current mirror 309. The resulting output current, labeled Driver Output Current, may be coupled to a TOSA modulator, such as the modulator 125 shown in FIG. 1.

Figure 4:
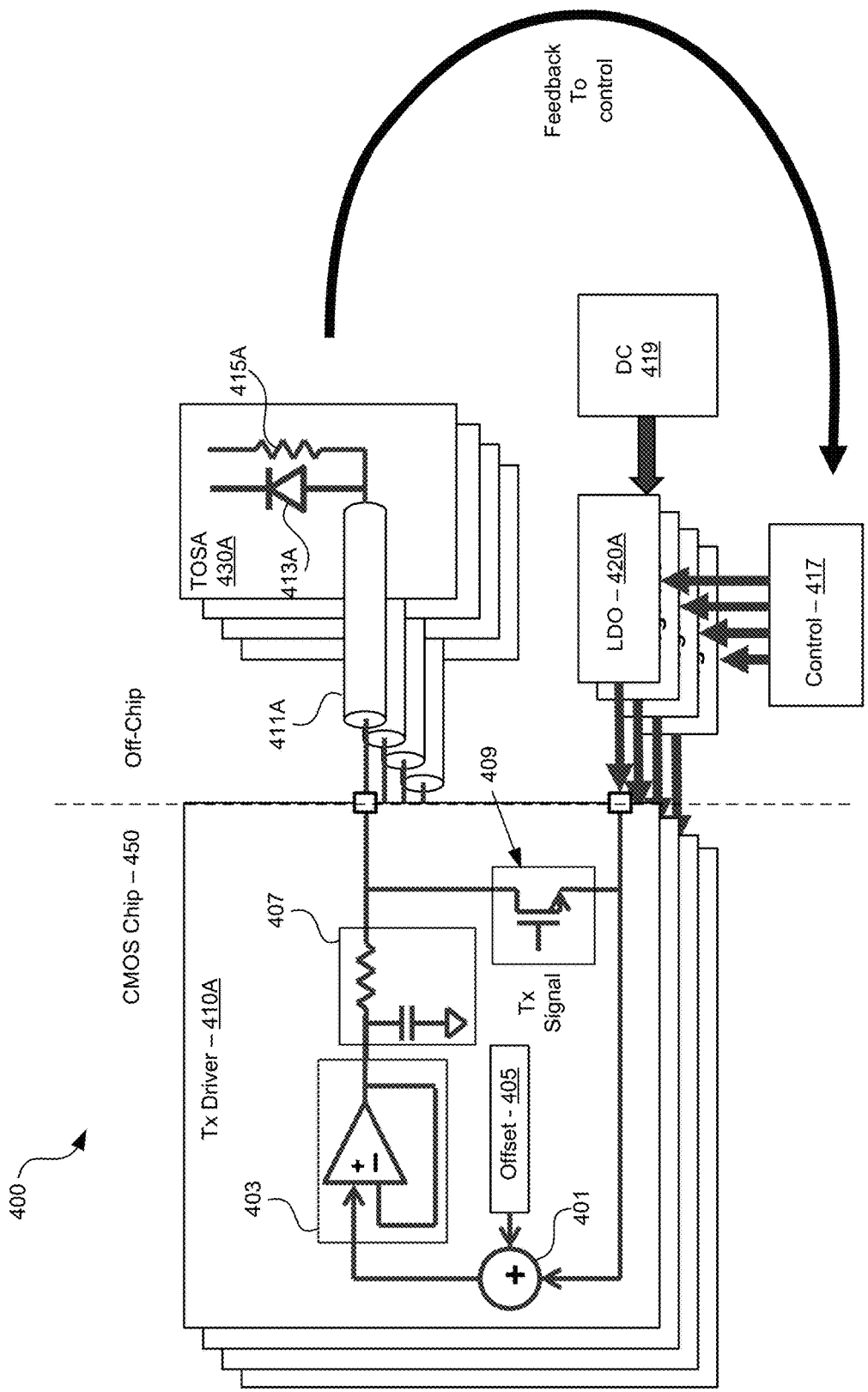
FIG. 4 illustrates an example implementation of a negative voltage DC-coupled modulator driver with bias set by power supply, in accordance with an example embodiment of the disclosure.

FIG. 4 illustrates an example implementation of a negative voltage DC-coupled modulator driver with bias set by power supply, in accordance with an example embodiment of the disclosure. Referring to FIG. 4, there is shown a quad transceiver implementation with four Tx drivers 410A-410D, four LDO regulators 420A-420D, four TOSAs 430A-430D, a DC/DC converter 419, and a regulator control unit 417. For figure clarity, only Tx driver 410A, LDO regulator 420A, and TOSA 430A are fully visible and labeled in the stack of four repeating elements.

The Tx driver 410A comprises circuitry for generating a DC-coupled drive signal for a modulator in the TOSA 430A. In an example scenario, the circuitry may comprise a summer 401, a voltage-regulator 403, an RC filter 407, and an output driver 409. Summer 401 may be operable to sum input voltage signals from the LDO regulator 420A and the offset voltage 405 to provide an output control signal to the DC voltage regulator 403. The termination filter 407 may function as a low-pass filter to filter out high frequency noise in the bias voltage provided by the voltage regulator 403 and to terminate reflected signals. The electrical coupling structures 411A-411D may comprise transmission lines or other suitable conductive structures for communicating electrical signals over the required distance from the Tx drivers 410A-410D to the TOSAs 430A-430D.

The DC bias of the output voltages of the Tx drivers 410A-410D may be configured by adjusting the power supply voltages provided by the LDO regulators 420A-420D to the Tx drivers 410A-410D. For example, the DC converter 419 may provide different voltages to the LDO regulators 420A-420D, or the LDO regulators 420A-420D may each be configured to different voltages using the regulator control unit 417. This allows individual external DC bias control while minimizing the voltage range and power dissipation of on-chip output driver circuits 409, which may be similar to the output driver circuit 209 and modulator driver 300. The adjustment of the bias voltages may be based on the optimal DC bias points as determined from such methods as EA modulator impedance or optical modulation amplitude (OMA). Furthermore, the offset may be programmable to support power optimization for lower swing.

In addition, this technique may still enable conventional methods of determining and engaging optimum biasing conditions for the TOSA modulators, such as by monitoring the optical signals generated by the TOSAs 430A-430D and configuring the LDO regulators 420A-420D using the regulator control unit 417.

Figure 5:
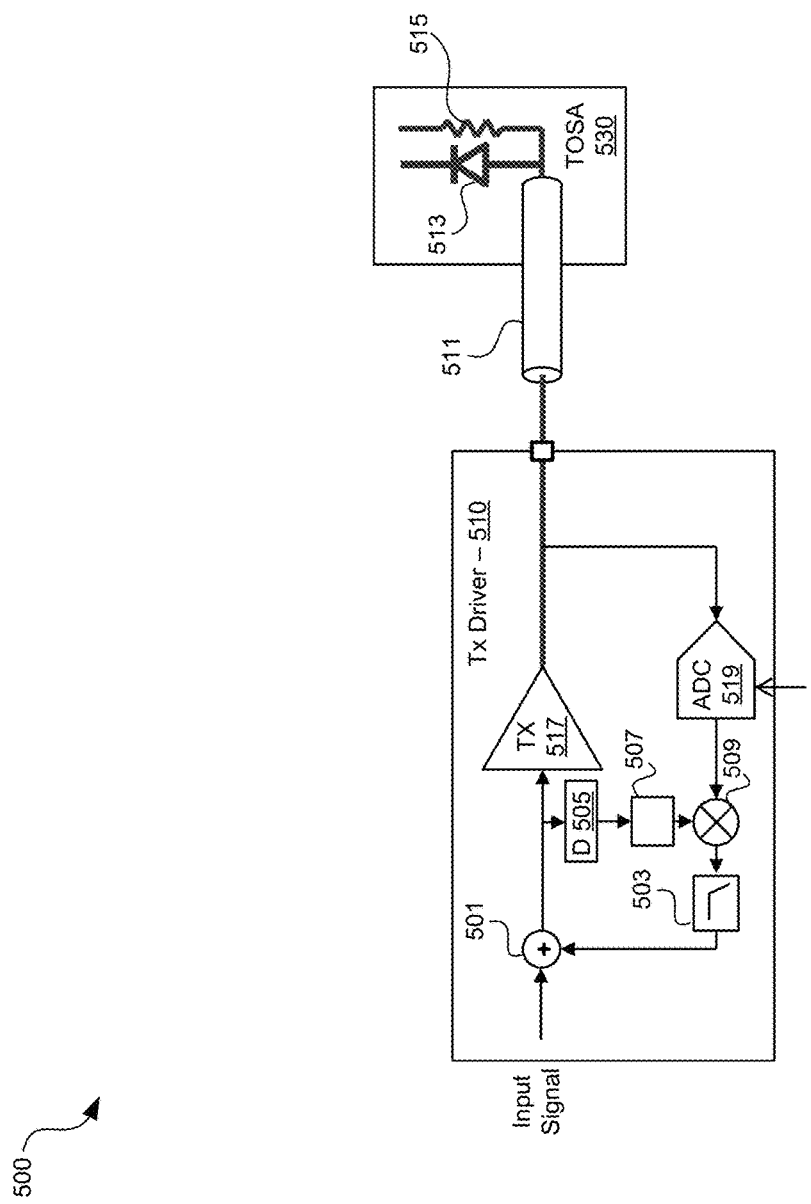
FIG. 5 illustrates an example implementation of a negative voltage DC-coupled modulator driver with optimization of modulator bias by monitoring reflections, in accordance with an example embodiment of the disclosure.

FIG. 5 illustrates an example implementation of a negative voltage DC-coupled modulator driver with optimization of modulator bias by monitoring reflections, in accordance with an example embodiment of the disclosure. Referring to FIG. 5, there is shown a transmitter 500 comprising a Tx driver 510, a TOSA 530, and electrical coupling structure 511. The structure of FIG. 5 may share any and all elements of FIGS. 1-4. For example, the transmitter 500 may be incorporated in the output driver circuit 209 or 409, described with respect to FIGS. 2 and 4, for improved bias control and to provide predistortion for better signal integrity.

The Tx driver 510 may comprise a summer 501, a low-pass filter 503, a delay 505, a multiplier 507, a mixer 509, a Tx gain stage 517, and an analog-to-digital converter (ADC) 519. A feedback path is configured from the output of the Tx gain stage 517, which is coupled to the TOSA 530 via the coupling structure 511, to the summer 501 via the ADC 519, the mixer 509, and the low-pass filter 503. The electrical coupling structure 511 may comprise a transmission line or other suitable conductive structure for communicating electrical signals over the required distance from the Tx driver 510 and the TOSA 530.

In an example scenario, the ADC 519 may comprise a sub-sampling ADC. The ADC 519 may be operable to receive an analog signal from the output of the Tx gain stage 517 and the input to the coupling structure 511 and generate a digital output signal proportional to the input signal. In this manner, the feedback path processes the signal generated by the Tx gain stage 517 as well as any signal reflected back from the TOSA 530.

The delay 505 may generate a delayed version of the output signal of the summer 501 that is coupled to the multiplier 507, which may generate a signal at a magnitude that is the square of the magnitude of the input signal to the multiplier 507, for example. This delayed and squared signal may be mixed with the output of the ADC 519 at the mixer 509, and then filtered by the low-pass filter 503 to filter out any high-frequency noise or harmonics. This filtered signal may then be summed with the input signal, thereby providing adaptive control, and/or predistortion, for the biasing conditions for a modulator in the TOSA 530.

In operation, the input signal to the Tx driver 510 may be summed with the feedback signal generated from the ADC 519 that is mixed with a delayed and squared version of the input signal to the Tx gain stage 517. The mixed signal may be filtered before being summed with the input signal. The output of the Tx gain stage 517 may be coupled to the TOSA 530 via the coupling structure 511 to drive a modulator, such as the modulator 125 shown in FIG. 1.

Figure 6:
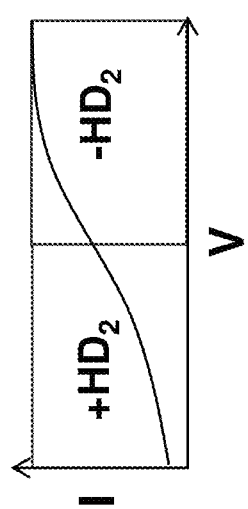
FIG. 6 illustrates electro-absorption modulator current-voltage characteristics, and regions of positive (+) and negative (−) second-order harmonic distortion (HD2), in accordance with an example embodiment of the disclosure.

FIG. 6 illustrates electro-absorption modulator current-voltage characteristics, in accordance with an example embodiment of the disclosure. Referring to FIG. 6, there is shown the current for an EA modulator, such as the modulator 125 in FIG. 1, versus voltage. In an EA modulator, photon absorption translates to current, and its lowest DC incremental resistance corresponds to the point of maximum absorption gain, or its maximum OMA. The DC resistance is visible as a reflection of the signal transmitted to the modulator, which comprises the output of the Tx driver 510 transmitted to the TOSA 530. Therefore, the feedback signal includes reflections from the modulator in the TOSA 530 and may be utilized to monitor the optimum biasing conditions.

Furthermore, the normal signal swing of the drive signal acts as a continual search (positive/negative) of the DC resistance, allowing adaptation based on reflected $HD_2$ of live data traffic. The use of reflections eliminates the need for external photodiodes for monitoring the output of the modulator and enables the integration of more functions.

Figure 7:
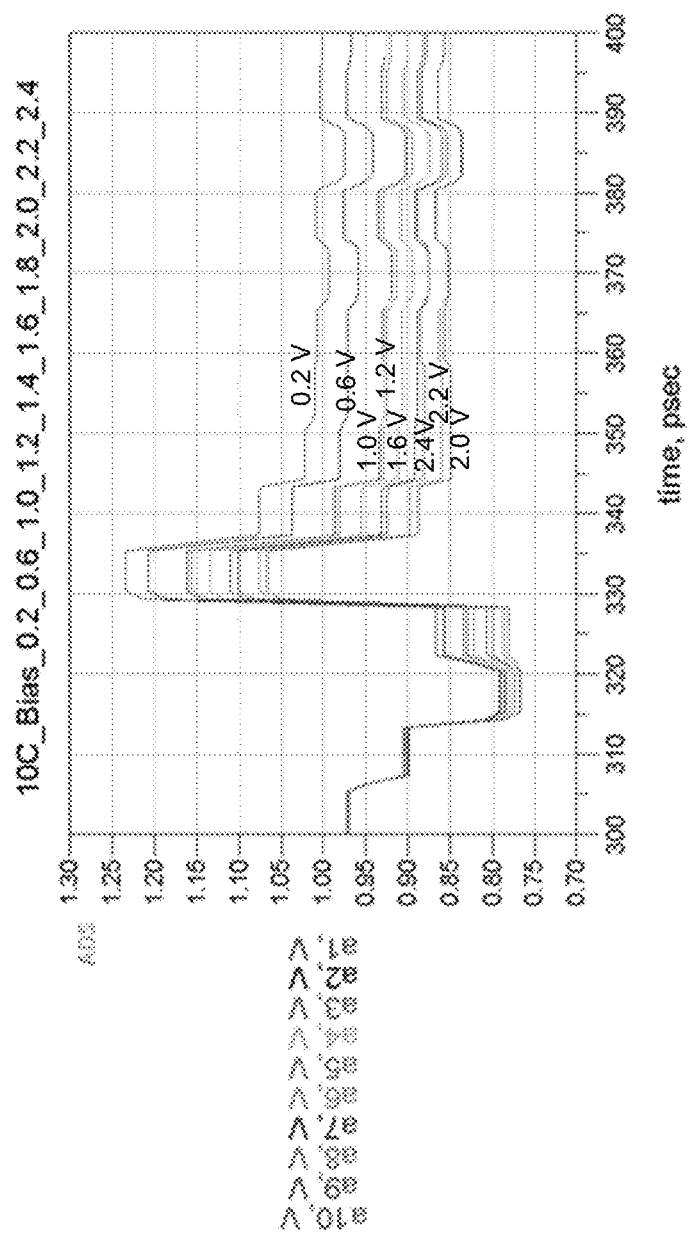
FIG. 7 illustrates reflected signals from an electro-absorption modulator versus time, in accordance with an example embodiment of the disclosure.

FIG. 7 illustrates reflected signals from an electro-absorption modulator versus time, in accordance with an example embodiment of the disclosure. Referring to FIG. 7, there are shown feedback signals, as indicated by the input signal to the ADC 519 in FIG. 5, at various bias conditions ranging from −0.2 to −2.4 Volts.

In an embodiment of the disclosure, a system for electro-absorption modulator drivers in CMOS may comprise an electro-absorption modulator optically coupled to a laser source and electrically coupled to a modulator driver circuit that is in a complementary metal oxide semiconductor (CMOS) chip. The electro-absorption modulator may comprise a summer for receiving a negative bias voltage and a programmable offset voltage, a voltage regulator for receiving the output of the summer and generating a DC termination voltage of lower magnitude than said negative bias voltage, level shifting circuitry for shifting a received data signal to a DC voltage level between said DC termination voltage from said voltage regulator and said negative bias voltage, and an electrical coupling structure for DC-coupling said level shifted data signal to said modulator.

The negative bias voltage may be received from an off-chip low drop out (LDO) voltage regulator. The level shifting circuitry may comprise cascode CMOS transistors and a current mirror. The level shifting circuitry may comprise a diode-connected CMOS transistor and stacked output stages. The modulator driver circuit may comprise a termination filter for filtering the voltage from the voltage regulator and for providing termination for reflected signals. The programmable offset voltage may be utilized to configure said negative DC voltage.

The electrical coupling structure may comprise a transmission line. The modulator driver circuit may comprise a feedback path for sensing signals reflected from said modulator where the feedback path may comprise an analog-to-digital converter (ADC), a mixer, and a delay element. The ADC may convert the reflected signals to digital signals and the mixer may combine the digital signals with a delayed version of the received data signal. The feedback path may comprise a multiplier and the feedback path may be used to monitor the amount of second-order harmonic distortion (HD2) of the data signal in the reflected signals. The monitoring may be used to adjust the DC termination voltage to optimize the operation point of the electro-absorption modulator.

Accordingly, the present method and/or system may be realized in hardware, firmware, software, and/or a combination of hardware, firmware, and/or software. The present method and/or system may be realized in a centralized fashion in at least one computer system, or in a distributed fashion where different elements are spread across several interconnected computer systems. Any kind of computer system or other system adapted for carrying out the methods described herein is suited. A typical combination of hardware and software may be a general-purpose computer system with a computer program that, when being loaded and executed, controls the computer system such that it carries out the methods described herein.

The present method and/or system may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present method and/or apparatus has been described with reference to certain implementations, it will be understood by those skilled in the art that various changes may be made and equivalents may be substituted without departing from the scope of the present method and/or apparatus. In addition, many modifications may be made to adapt a particular situation or material to the teachings of the present disclosure without departing from its scope. Therefore, it is intended that the present method and/or apparatus not be limited to the particular implementations disclosed, but that the present method and/or apparatus will include all implementations falling within the scope of the appended claims.

What is claimed is:

1. A system, comprising:
an electro-absorption modulator optically coupled to a laser source and electrically coupled to a modulator driver circuit and a processor, said modulator driver circuit being in a complementary metal oxide semiconductor (CMOS) chip and comprising:
a summer for receiving a negative bias voltage and an offset voltage in the CMOS chip;
a voltage regulator for receiving an output of the summer and generating a DC termination voltage of lower magnitude than said negative bias voltage;
level shifting circuitry for shifting a data signal received from the processor to a negative DC voltage level between said DC termination voltage from said voltage regulator and said negative bias voltage; and
an electrical coupling structure for DC-coupling said level shifted data signal to said modulator.

2. The system of claim 1, wherein said negative bias voltage is received from an off-chip low drop out (LDO) voltage regulator.

3. The system of claim 1, wherein said level shifting circuitry comprises cascode CMOS transistors and a current mirror.

4. The system of claim 3, wherein said level shifting circuitry further comprises a diode-connected CMOS transistor and stacked output stages.

5. The system of claim 1, wherein said modulator driver circuit comprises a filter for filtering the voltage from the voltage regulator.

6. The system of claim 1, wherein said offset voltage is utilized to configure said DC termination voltage.

7. The system of claim 1, wherein said electrical coupling structure comprises a transmission line.

8. The system of claim 1, wherein said modulator driver circuit comprises a feedback path for sensing signals reflected from said modulator, and wherein reflections are proportional to an incremental resistance of the modulator.

9. The system of claim 8, wherein said feedback path comprises an analog-to-digital converter (ADC), a mixer, and a delay element.

10. The method according to claim 9, wherein said feedback path comprises a multiplier and wherein said feedback path is used to monitor the amount of second-order harmonic distortion (HD2) of said data signal in said reflected signals.

11. The method according to claim 10, wherein said monitoring is used to adjust said DC termination voltage to optimize an operation point of said electro-absorption modulator.

12. The system of claim 9, wherein said ADC converts said reflected signals to digital signals and said mixer combines said digital signals with a delayed version of said received data signal.

13. A method, comprising:
in an electro-absorption modulator optically coupled to a laser source and electrically coupled to a modulator driver circuit and a processor, said modulator driver circuit being in a complementary metal oxide semiconductor (CMOS) chip and comprising a summer, a voltage regulator, and level shifting circuitry:
summing a negative bias voltage and an offset voltage in the CMOS chip utilizing said summer;
generating a DC termination voltage of lower magnitude than that of said negative bias voltage utilizing said voltage regulator;
shifting a data signal received from the processor to a negative DC voltage level between said DC termination voltage from said voltage regulator and said negative bias voltage utilizing said level shifting circuitry; and
DC-coupling said level shifted data signal to said modulator utilizing an electrical coupling structure.

14. The method of claim 13, further comprising receiving said negative bias voltage from an off-chip low drop out (LDO) voltage regulator.

15. The method of claim 13, wherein said level shifting circuitry comprises cascode CMOS transistors and a current mirror.

16. The method according to claim 15, wherein said level shifting circuitry further comprises a diode-connected CMOS transistor and stacked output stages.

17. The method of claim 13, wherein said modulator driver circuit comprises a termination filter for filtering the voltage from the voltage regulator.

18. The method of claim 13, further comprising configuring said DC termination voltage using said programmable offset voltage.

19. The method of claim 13, wherein said modulator driver circuit comprises a feedback path for sensing signals reflected from said modulator, and wherein the reflected signals are proportional to an incremental resistance of the modulator.

20. The method of claim 19, wherein said feedback path comprises an analog-to-digital converter (ADC), a mixer, a delay element, and a low-pass filter.

21. The method of claim 20, wherein said feedback path comprises a multiplier and wherein said feedback path is used to monitor the amount of second-order harmonic distortion (HD2) of said data signal in said reflected signals.

22. A method of claim 21, wherein said monitoring is used to adjust said DC termination voltage to optimize an operation point of said electro-absorption modulator.

23. The method of claim 19, further comprising converting said reflected signals to digital signals and combining said digital signals with a delayed version of said received data signal using said mixer.

24. A system, comprising:
an electro-absorption modulator optically coupled to a laser source and electrically coupled to a modulator driver circuit, said modulator driver circuit being in a complementary metal oxide semiconductor (CMOS) chip and comprising:
a summer for receiving a negative bias voltage and a programmable offset voltage;
a voltage regulator for receiving an output of the summer and generating a DC termination voltage of lower magnitude than said negative bias voltage;
level shifting circuitry comprising cascode CMOS transistors and a current mirror for shifting a received data signal to a DC voltage level between said negative DC voltage from said voltage regulator and said negative bias voltage; and
a transmission line for DC-coupling said level shifted data signal to said modulator.

* * * * *